United States Patent
Hsu et al.

(10) Patent No.: US 10,332,844 B2
(45) Date of Patent: Jun. 25, 2019

(54) MANUFACTURING METHOD OF PACKAGE STRUCTURE

(71) Applicant: Powertech Technology Inc., Hsinchu County (TW)

(72) Inventors: Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/717,956

(22) Filed: Sep. 28, 2017

(65) Prior Publication Data

US 2018/0190594 A1 Jul. 5, 2018

Related U.S. Application Data

(60) Provisional application No. 62/441,920, filed on Jan. 3, 2017.

(30) Foreign Application Priority Data

May 31, 2017 (TW) .............................. 106117813 A (51) Int. Cl.
  *H01L 21/00* (2006.01)
  *H01L 23/552* (2006.01)
  (Continued)

(52) U.S. Cl.
  CPC .......... *H01L 23/552* (2013.01); *H01L 21/486* (2013.01); *H01L 21/4853* (2013.01);
  (Continued)

(58) Field of Classification Search
  None
  See application file for complete search history.

(56) References Cited

U.S. PATENT DOCUMENTS

| 2013/0075892 A1* | 3/2013 | Lin ..................... H01L 25/0652 |
| | | 257/737 |
| 2016/0013172 A1* | 1/2016 | Lin ......................... H01L 25/50 |
| | | 438/108 |

(Continued)

FOREIGN PATENT DOCUMENTS

| TW | 200933767 | 8/2009 |
| TW | 201212178 | 3/2012 |
| TW | I562323 | 12/2016 |

OTHER PUBLICATIONS

"Office Action of Taiwan Counterpart Application," dated Nov. 17, 2017, p. 1-p. 4, in which the listed references were cited.

*Primary Examiner* — Reema Patel
(74) *Attorney, Agent, or Firm* — JCIPRNET (57) ABSTRACT

A manufacturing method of a packaging structure is provided. First, a carrier is provided. A conductive layer is formed on the carrier. A conductive frame is formed on the conductive layer. The conductive frame is in contact with and electrically connected to the conductive layer. A chip is placed on the conductive layer. The conductive frame surrounds the chip. An insulation encapsulation is formed to encapsulate the chip, and the insulation encapsulation exposes an active surface of the chip. A redistribution layer is formed on the active surface of the chip. The redistribution layer extends from the active surface to the insulation encapsulation.

10 Claims, 11 Drawing Sheets (51) Int. Cl.
  *H01L 23/538* (2006.01)
  *H01L 23/00* (2006.01)
  *H01L 21/78* (2006.01)
  *H01L 21/48* (2006.01)
  *H01L 21/56* (2006.01)
  *H01L 23/31* (2006.01)

(52) U.S. Cl.
  CPC ........ *H01L 21/4857* (2013.01); *H01L 21/561* (2013.01); *H01L 21/565* (2013.01); *H01L 21/78* (2013.01); *H01L 23/3114* (2013.01); *H01L 23/3128* (2013.01); *H01L 23/5383* (2013.01); *H01L 23/5384* (2013.01); *H01L 23/5386* (2013.01); *H01L 23/5389* (2013.01); *H01L 24/20* (2013.01); *H01L 24/96* (2013.01); *H01L 21/568* (2013.01); *H01L 2224/04105* (2013.01); *H01L 2224/12105* (2013.01); *H01L 2224/16227* (2013.01); *H01L 2224/214* (2013.01); *H01L 2224/32245* (2013.01); *H01L 2224/73267* (2013.01); *H01L 2224/81005* (2013.01); *H01L 2224/92244* (2013.01); *H01L 2224/95001* (2013.01); *H01L 2224/97* (2013.01); *H01L 2924/15311* (2013.01); *H01L 2924/3025* (2013.01)

(56) References Cited

U.S. PATENT DOCUMENTS

| | | |
|---|---|---|
| 2016/0073496 A1 | 3/2016 | Vincent |
| 2017/0062357 A1 | 3/2017 | Kamgaing et al. |
| 2017/0077039 A1* | 3/2017 | Liao ..................... H01L 23/552 |
| 2017/0365587 A1* | 12/2017 | Hung ................. H01L 23/5386 |

* cited by examiner

MANUFACTURING METHOD OF PACKAGE STRUCTURE

CROSS REFERENCE TO RELATED APPLICATION

This application claims the priority benefits of U.S. provisional application Ser. No. 62/441,920, filed on Jan. 3, 2017, and Taiwan application serial no. 106117813, filed on May 31, 2017. The entirety of each of the above-mentioned patent applications is hereby incorporated by reference herein and made a part of specification.

BACKGROUND OF THE INVENTION

1. Field of the Invention

The invention relates to a manufacturing method of a packaging structure, and particularly relates to a manufacturing method of a packaging structure including a conductive frame.

2. Description of Related Art

Through the development of science and technology, in order to meet the market requirements of being lightweighted, thin, compact and small, the size of semiconductor devices gradually decreases, and the distance between semiconductor devices also becomes shorter and shorter. However, a semiconductor device may be easily influenced by electromagnetic waves generated by an adjacent semiconductor device, and is thus unable to function correctly. Such influence is particularly significant in small-sized semiconductor devices.

In the conventional packaging structure, a metal casing is commonly disposed in a packaging structure to reduce electromagnetic interference (EMI) received by a semiconductor device. However, it is complicated to manufacture a packaging structure having a metal casing, and the size of such packaging structure is greater. Thus, it requires additional work provide a more desirable packaging structure.

SUMMARY OF THE INVENTION

The embodiment of the invention provides a manufacturing method of a packaging structure having a simpler manufacturing process and the packaging structure is capable of reducing electromagnetic interferences received by a chip.

A manufacturing method of a packaging structure according to an embodiment of the invention includes the following. A carrier is provided. A conductive layer is formed on the carrier. A conductive frame is formed on the conductive layer. The conductive frame is connected to the conductive layer. A plurality of chips are placed on the conductive layer. Each of the chips includes an active surface and a back surface opposite to the active surface. The back surface of the chip is adhered to the conductive layer, and the conductive frame surrounds the chip. An insulation encapsulation is formed to encapsulate the chip. The insulation encapsulation exposes the active surface of each of the chips. A redistribution layer is formed on the active surface of each of the chips. The redistribution layer extends from the active surface toward the insulation encapsulation.

A manufacturing method of a packaging structure according to an embodiment of the invention includes the following. A carrier is provided. A redistribution layer is formed on the carrier. A conductive frame is formed on the redistribution layer. A plurality of chips are placed on the redistribution layer. Each of the chips includes an active surface and a back surface opposite to the active surface. The active surface of each of the chips is electrically connected to the redistribution layer, and the conductive frame surrounds the chips. An insulation encapsulation is formed to encapsulate the chips. A conductive layer is formed on the insulation encapsulation. The conductive frame is connected to the conductive layer.

Based on the above, the packaging structure according to the embodiments of the invention includes the conductive frame and the conductive layer. The conductive frame and the conductive layer are able to reduce electromagnetic interferences received by the chip. The manufacturing method of the packaging structure according to the embodiments of the invention has a simpler manufacturing process and is capable of reducing a manufacturing cost.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1I are schematic cross-sectional views illustrating a manufacturing method of a packaging structure according to an embodiment of the invention.

Figure 1A:
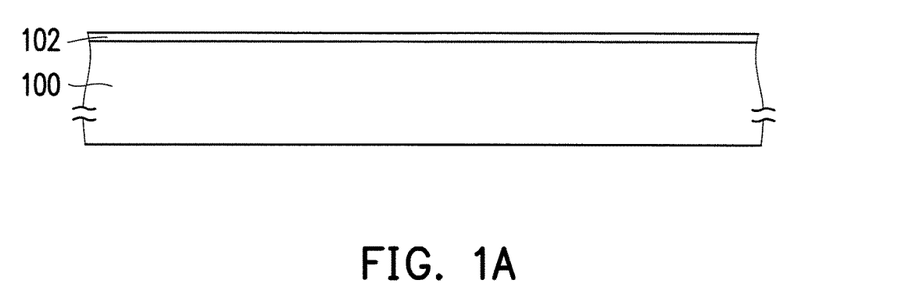
FIGS. 1A to 1I are schematic cross-sectional views illustrating a manufacturing method of a packaging structure according to an embodiment of the invention.

Referring to FIG. 1A, a carrier 100 is provided. In an embodiment, the carrier 100 includes an adhesive layer 102 located on a surface of the carrier 100. The adhesive layer 102 may further include a releasing layer.

Figure 1B:
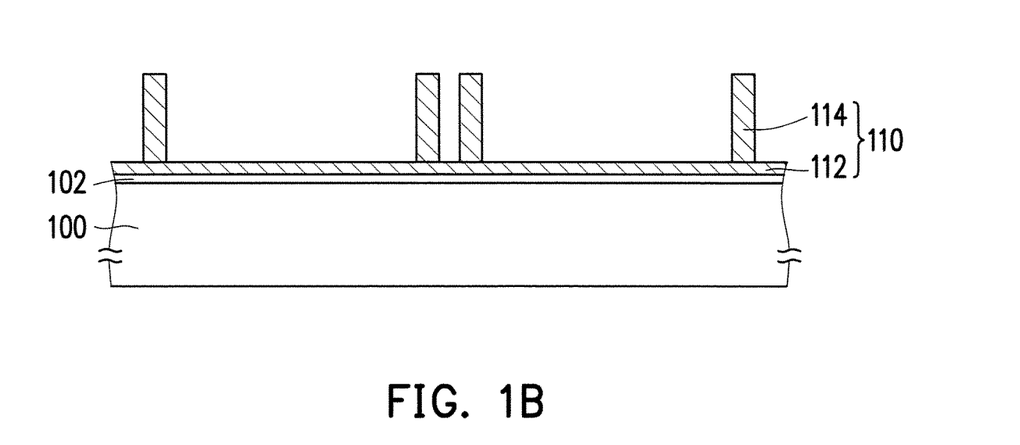

Referring to FIG. 1B, a conductive layer 112 is formed on the carrier 100. For example, the conductive layer 112 is formed on the adhesive layer 102 that is formed on the carrier 100. In other words, the adhesive layer 102 may be disposed between the conductive layer 112 and the carrier 100. A process of forming the conductive layer 112 may include performing a physical vapor deposition process (e.g., sputtering) or an electroplating process. A material of the conductive layer 112 may include copper, tin, aluminum, steel, or other suitable conductive material.

A conductive frame 114 is formed on the conductive layer 112 carried by the carrier 100. The conductive frame 114 is in contact with and electrically connected to the conductive layer 112. In an embodiment, a process of forming the conductive frame 114 includes forming an insulating layer (e.g., a photoresist) on the conductive layer 112; patterning the insulating layer to form a patterned insulating layer having a plurality openings therein, wherein the conductive layer 112 are partially exposed by the openings of the patterned insulating layer; filling the plurality of openings of the patterned insulating layer with conductive material through an electroplating process; and removing the insulating layer to expose portions of the conductive layer 112 which are not covered by the conductive material. In an embodiment, the conductive frame 114 is directly formed on the conductive layer 112. In other words, the conductive frame 114 and the conductive layer 112 are connected and integrated to form a single structure. Therefore, it does not require an additional structure to fix the conductive frame 114 on to the conductive layer 112. In an exemplary embodiment, a material of the conductive frame 114 may be the same as the material of the conductive layer 112. For example, the conductive frame 114 may extend in a direction perpendicular to a surface on the carrier 100 where the conductive layer 112 is located. In some embodiment, the conductive frame 114 and the conductive layer 112 are electrically connected to a ground voltage or a voltage provided by an external power source. In some embodiment, the conductive frame 114 and the conductive layer 112 have preferable thermal conductivities. The conductive frame 114 and the conductive layer 112 are capable of facilitating heat dissipation of the packaging structure. In some embodiment, the material of the conductive frame 114 and the conductive layer 112 may include conductive materials with predetermined rigidity, so that the conductive frame 114 and the conductive layer 112 may have enough strength to serve as a support structure and reduce warpage of the packaging structure. In addition, the process window of sequentially performed processes, such as a photolithography process, molding process, grinding process, formation of redistribution layer, and so on enlarged because the warpage issue of the packaging structure may be controlled using the conductive frame 114 and the conductive layer 112.

Figure 1C:
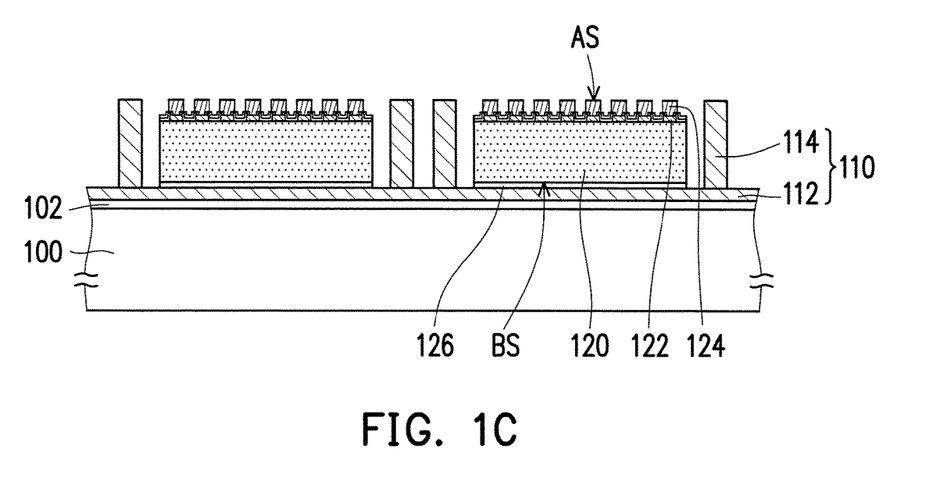

Referring to FIG. 1C, a plurality of chips 120 are picked-up and placed on the conductive layer 112. The chip 120 includes an active surface AS and a back surface BS opposite to the active surface AS. In some embodiment, the chip 120 includes chip pads 122 and conductive bumps 124 formed on the active surface AS. The conductive bumps 124 are electrically connected to the chip pads 122. A material of the conductive bumps 124 includes copper, tin, gold, nickel, or other conductive materials. For example, the conductive bump 124 may be a single-layer structure or a multi-layer structure formed of copper, gold, nickel, or other conductive materials.

The back surface BS of the chip 120 is adhered to the conductive layer 112 and the conductive frame 114 surrounds the chip 120. In some embodiment, an adhesive layer 126 is provided on the back surface BS of the chip 120, and the chip 120 is adhered to the conductive layer 112 through the adhesive layer 126.

Figure 1D:
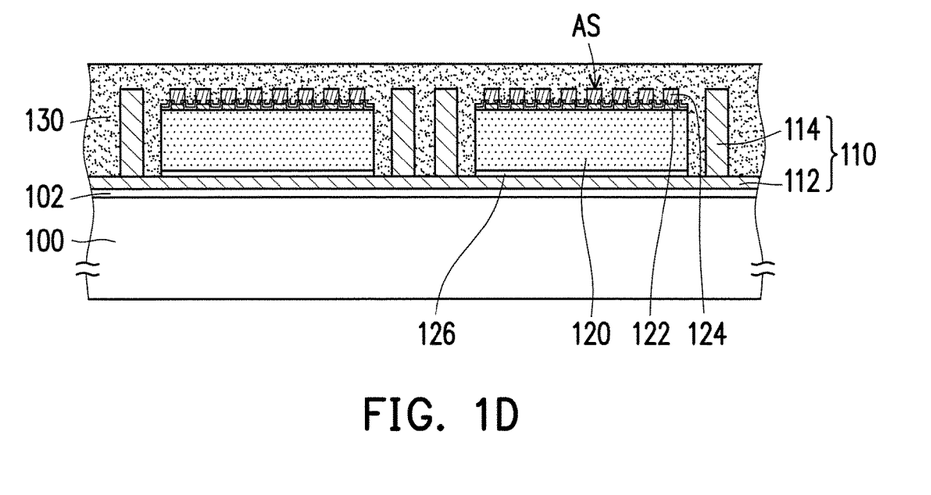

Referring to FIG. 1D, an insulation encapsulation 130 is formed to cover or encapsulate the conductive layer 112, the chip 120, and the conductive frame 114. In some embodiment, the insulation encapsulation 130 may be formed on the conductive layer 112 carried by the carrier 100 by performing a molding process. For example, a material of the insulation encapsulation 130 includes an epoxy resin or other suitable polymer materials. In some embodiment, a material of the insulation encapsulation 130 may be an epoxy resin or other suitable polymer materials including fillers distributed therein. A material of the fillers include silicon dioxide, aluminum oxide, or other suitable materials. The fillers are capable of reinforcing mechanical strength of the insulation encapsulation 130 such that the insulation encapsulation 130 may well protect the chip 120. A height (or thickness) of the insulation encapsulation 130 may be greater than heights (or thickness) of the chip 120 and the conductive frame 114. In addition, the insulation encapsulation 130 encapsulates the active surface AS of the chip 120.

Figure 1E:
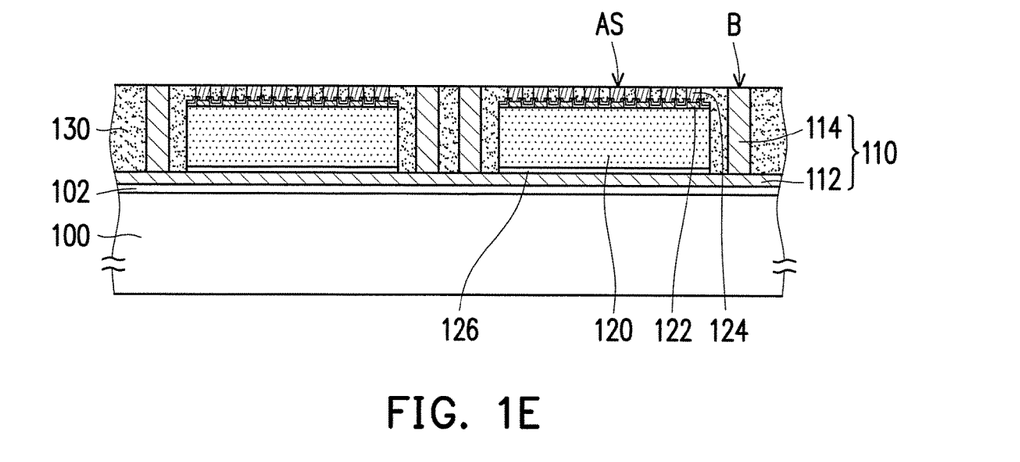

Referring to FIG. 1E, a grinding process is performed on the insulation encapsulation 130 to remove a portion of the insulation encapsulation 130 until the active surface AS of the chip 120 is exposed. The grinding process includes performing a mechanical grinding process, a chemical-mechanical grinding (CMP) process, an etching process, other suitable processes, or the combinations thereof. The above-mentioned grinding process may further reduce an overall thickness of the packaging structure. In other embodiments, a thickness of the conductive frame 114 is equal to a thickness of the chip 120 after performing the grinding process. In some embodiment, when the grinding process is performed on the insulation encapsulation 130, a portion of the conductive frame 114 is also removed. After the grinding process, the conductive bumps 124 of the chip 120, a first surface B of the conductive frame 114, and a top surface of the insulation encapsulation 130 are coplanar to each other. In some embodiment, since the adhesive layer 126 is provided between the conductive layer 112 and the back surface BS of the chip 120, the thickness of the conductive frame 114 is equal to a total thickness of the chip 120 and the adhesive layer 126 after the conductive frame 114 is ground.

Figure 1F:
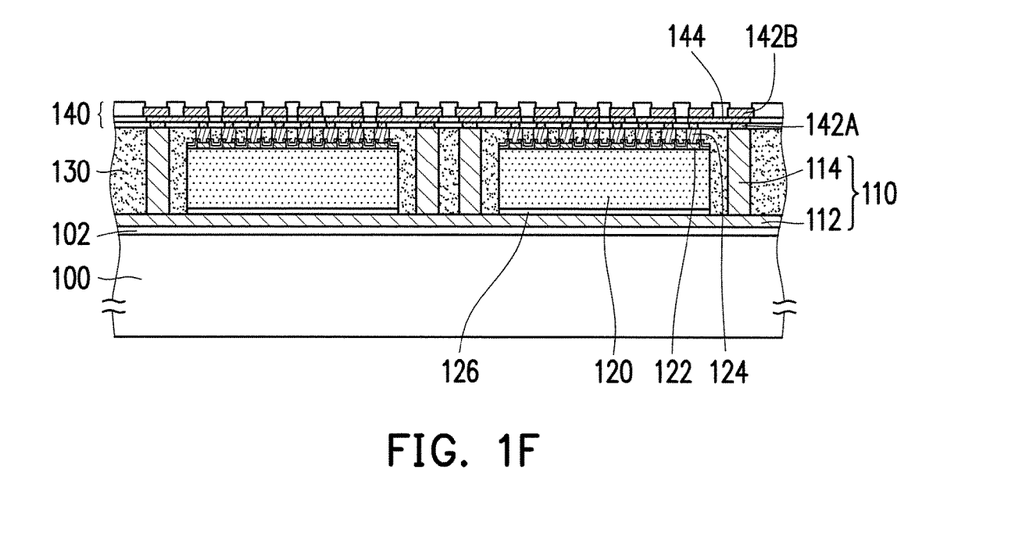

Referring to FIG. 1F, a redistribution layer 140 is formed on the active surface AS of the chip 120 and the top surface of the insulation encapsulation 130. The redistribution layer 140 extends from the active surface AS of the chip 120 toward the insulation encapsulation 130 and the first surface B of the conductive frame 114. In some embodiment, some of the pads 142A are electrically connected to the conductive frame 114. The pads 142A and the conductive frame 114 are electrically connected to the same voltage (e.g., a ground voltage or a voltage provided by an external power source). However, the invention is not limited thereto. In other embodiments, the conductive frame 114 can be physically separated from the pads 142A, and the conductive frame 114 may be electrically floated. In some embodiment, the redistribution layer 140 includes a conductive wire layer 144, the pads 142A, and the pads 142B. The pads 142A are closer to the insulation encapsulation 130 then the pads 142B in a direction perpendicular to the carrier 100. Compared with the pads 142A, the pads 142B are relatively distant from the insulation encapsulation 130 in a direction perpendicular to the carrier 100. The pads 142B are electrically connected to the pads 142A via the conductive wire layer 144. The conductive wire layer 144, the pads 142A, and the pads 142B are formed in a plurality of dielectric layers. Some of the pads 142A of the redistribution layer 140 are electrically connected to the conductive bumps 124 of the chip 120.

Even though FIG. 1F illustrates one conductive wire layer, the invention is not limited thereto. In some embodiments, the number of the conductive wire layer may be modified based on needs, and the dielectric layers may include contact holes for electrical connection between the conductive wire layer 144, the pads 142A and the pads 142B. In addition, the numbers of pads and contact holes may also be modified based on needs.

Figure 1G:
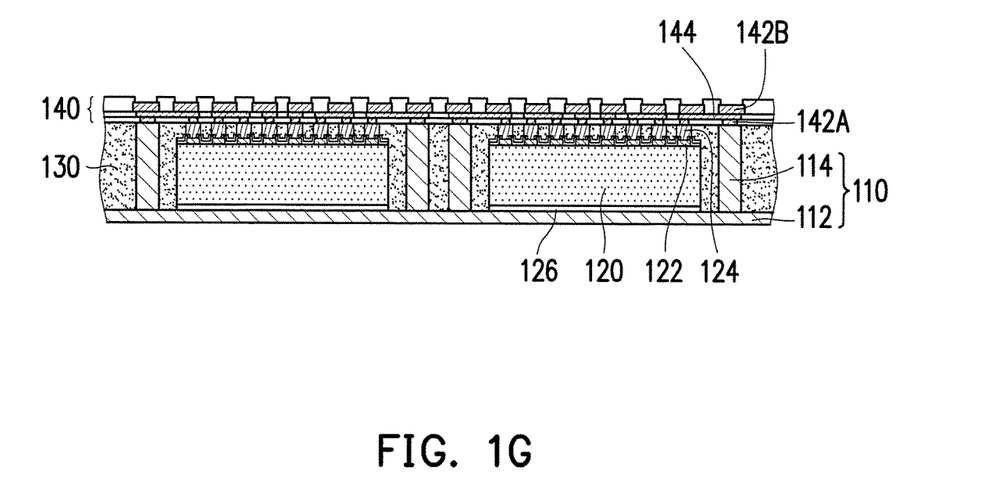

Referring to FIG. 1G, the carrier 100 is removed or de-bonded from the conductive layer 112. A conductive casing 110 including the conductive layer 112 and the conductive frame 114 is formed. As shown in FIG. 1B through FIG. 1G, the conductive casing 110 including the conductive layer 112 and the conductive frame 114 is formed on the carrier 100 without the need of being transferred to other temporary carrier. Thus, the manufacturing process of the conductive casing 110 is simplified, and the manufacturing cost is reduced.

Figure 1H:
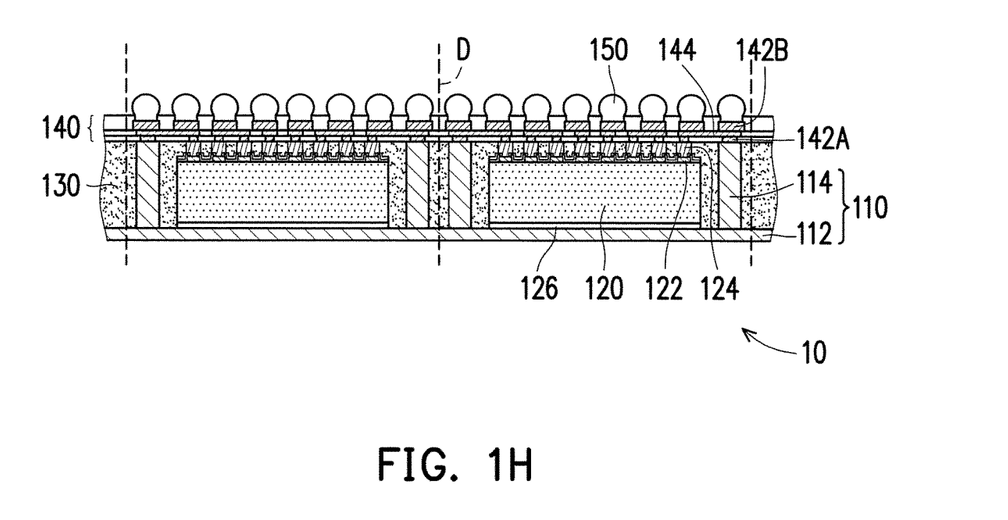

Referring to FIG. 1H, a plurality of conductive balls 150 are formed on the redistribution layer 140. The conductive balls 150 are electrically connected with the pads 142B of the redistribution layer 140. The conductive balls 150 are disposed in correspondence with the pads 142B and are electrically connected with the chip 120 through the redistribution layer 140. In some embodiment, the conductive balls 150 include tin balls or solder balls, for example. However, the invention is not limited thereto. Other types of conductive structures or conductive structures formed of other materials may also be utilized. For example, in other embodiments, the conductive balls 150 may be conductive pillars or conductive bumps. In some embodiment, the conductive balls 150 may be formed by performing a ball mounting process and a reflow process. In the embodiment, the conductive balls 150 are formed after removing the carrier 100. However, the invention is not limited thereto. In other embodiments, the carrier 100 is removed or de-bonded from the conductive layer 112 after forming the conductive balls 150. A singulation process is performed to form a plurality of singulated packaging structures 10. For example, the singulation process is performed by singulating the adjacent packaging structures 10 along scribe lines D.

Figure 1I:
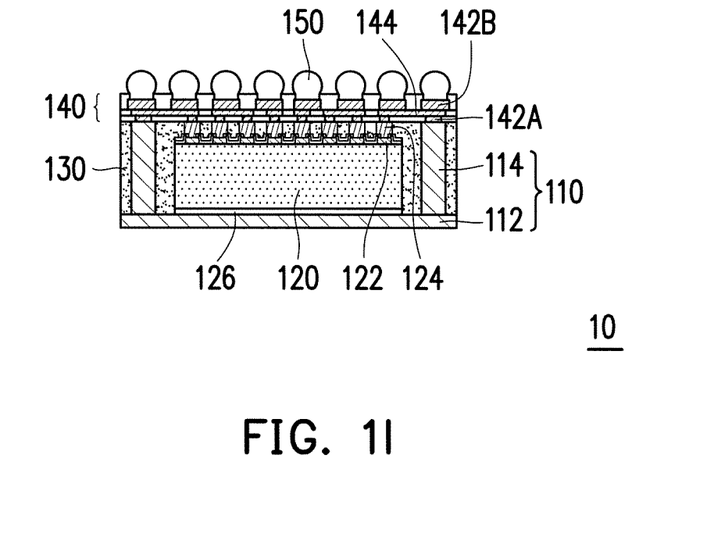

Referring to FIGS. 1I, the packaging structure 10 of the embodiment includes the conductive casing 110, the chip 120, the insulation encapsulation 130, the redistribution layer 140, and the conductive balls 150. The conductive casing 110 includes the conductive layer 112 and the conductive frame 114. The conductive casing 110 is able to reduce the electromagnetic interferences suffered by the chip 120. The conductive casing 110, the chip 120, the insulation encapsulation 130, and the redistribution layer 140 in the packaging structure 10 according to the embodiment of the invention are formed on the carrier 100 without the need of being transferred to another temporary carrier. Thus, the manufacturing process is simpler, and the manufacturing cost is reduced.

Figure 2:
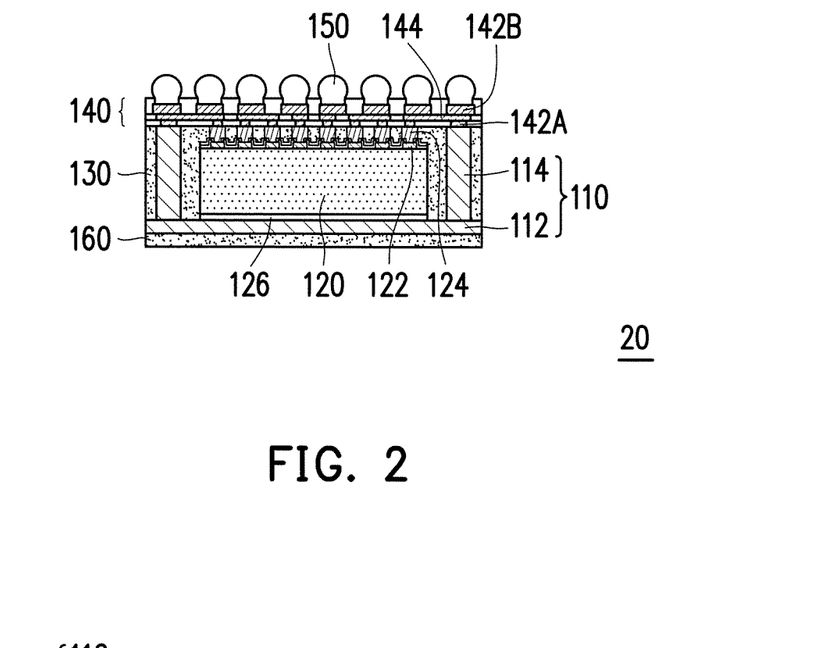
FIG. 2 is a schematic cross-sectional view illustrating a packaging structure according to an embodiment of the invention.

FIG. 2 is a schematic cross-sectional view illustrating a packaging structure according to an embodiment of the invention. It should be noted that the reference numerals and a part of the contents in the embodiment of FIGS. 1A to 1I are used in the following embodiment of FIG. 2, in which identical reference numerals indicate identical or similar components, and repeated description of the same technical contents is omitted. For a detailed description of the omitted parts, reference can be found in the previous embodiment, and no repeated description is contained in the following embodiments.

A packaging structure 20 of FIG. 2 is similar to the packaging structure 10 of FIGS. 1A to 1I except that the packaging structure 20 of FIG. 2 further includes a protection film 160.

Referring to FIG. 2, the conductive layer 112 includes a first surface and a second surface opposite to the first surface. The first surface of the conductive layer 112 faces toward the chip 120. The protection film 160 is formed on the second surface of the conductive layer 112. In some embodiment, a material of the protection film 160 is the same as the material of the insulation encapsulation 130. In some embodiment, the protection film 160 is patterned to form a symbol.

Figure 3:
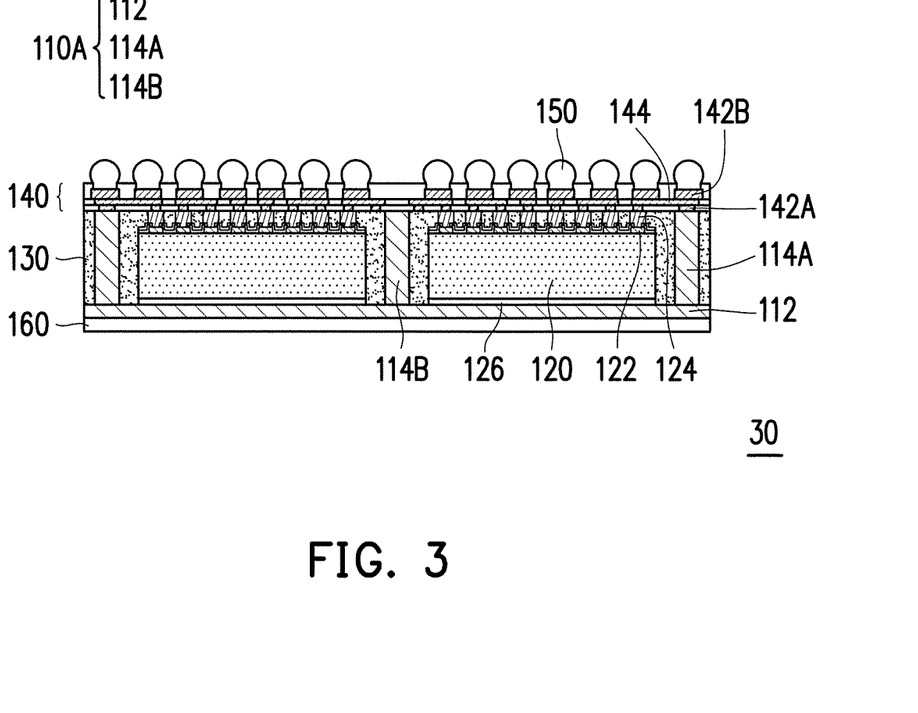
FIG. 3 is a schematic cross-sectional view illustrating a packaging structure according to an embodiment of the invention.

FIG. 3 is a schematic cross-sectional view illustrating a packaging structure according to an embodiment of the invention. It should be noted that the reference numerals and a part of the contents in the embodiment of FIGS. 1A to 1I are used in the following embodiment of FIG. 3, in which identical reference numerals indicate identical or similar components, and repeated description of the same technical contents is omitted. For a detailed description of the omitted parts, reference can be found in the previous embodiment, and no repeated description is contained in the following embodiments.

A packaging structure 30 of FIG. 3 is similar to the packaging structure 10 of FIGS. 1A to 1I except that the packaging structure 30 of FIG. 3 includes two or more of the chips 120, whereas the packaging structure 10 of FIG. 1I includes one chip.

In the packaging structure 30, a conductive casing 110A further includes a conductive frame 114B. The conductive frame 114B separates the chips 120 from one another. The conductive frame 114A surrounds the lateral sides of the chips 120. In some embodiment, the conductive frames 114B and 114A are foil led simultaneously. In some embodiment, the conductive frame 114B, the conductive frame 114A, and the conductive layer 112 are connected and integrated to form the conductive casing 110A.

FIGS. 4A to 4I are schematic cross-sectional views illustrating a manufacturing method of a packaging structure according to an embodiment of the invention. It should be noted that the reference numerals and a part of the contents in the embodiment of FIGS. 1A to 1I are used in the following embodiment of FIGS. 4A to 4I, in which identical reference numerals indicate identical or similar components, and repeated description of the same technical contents is omitted. For a detailed description of the omitted parts, reference can be found in the previous embodiment, and no repeated description is contained in the following embodiments.

Figure 4A:
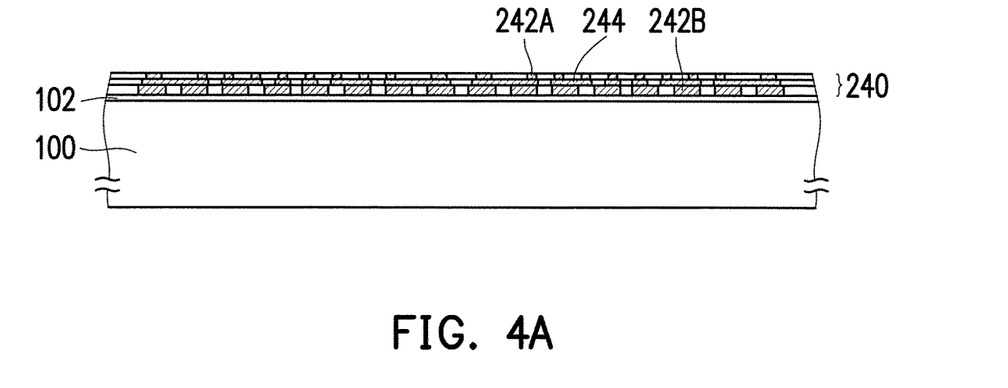
FIGS. 4A to 4I are schematic cross-sectional views illustrating a manufacturing method of a packaging structure according to an embodiment of the invention.

Referring to FIG. 4A, a redistribution layer 240 is formed on the carrier 100. In an embodiment, the redistribution layer 240 includes a conductive wire layer 244, pads 242A, and pads 242B. The pads 242B are closer to the carrier 100 than the pads 242A in a direction perpendicular to the carrier 100. Compared with the pads 242B, the pads 242A are at a distance from the carrier 100 in a direction perpendicular to the carrier 100. The pads 242B are electrically connected to the pads 242A via the conductive wire layer 244. The conductive wire layer 244, the pads 242A, and the pads 242B are formed in a plurality of dielectric layers.

Figure 4B:
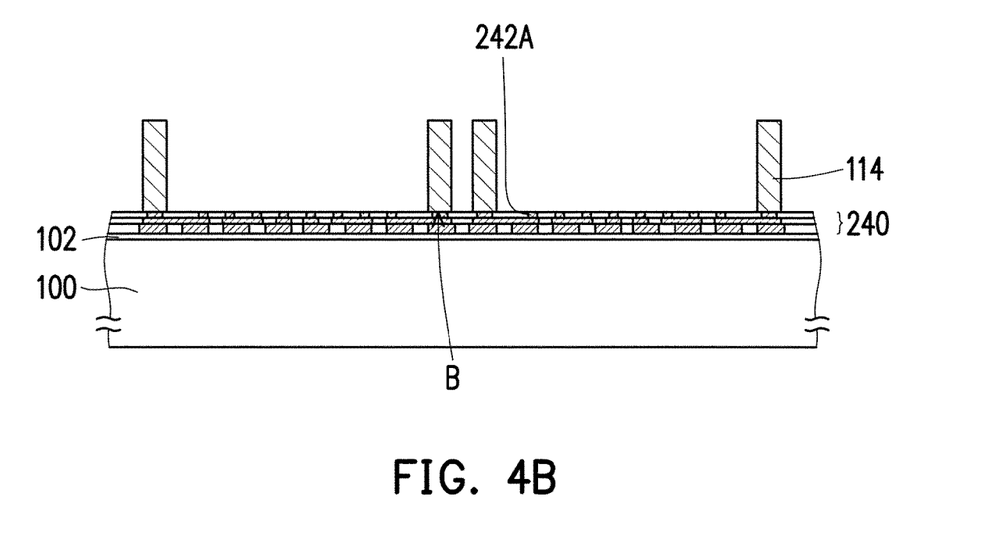

Then, referring to FIG. 4B, the conductive frame 114 is formed on the redistribution layer 240. The first surface B of the conductive frame 114 is connected with the redistribution layer 240. In some embodiment, some of the pads 242A are electrically connected with the conductive frame 114. However, the invention is not limited thereto. In other embodiments, the conductive frame 114 can be physically separated from the pads 242A.

Figure 4C:
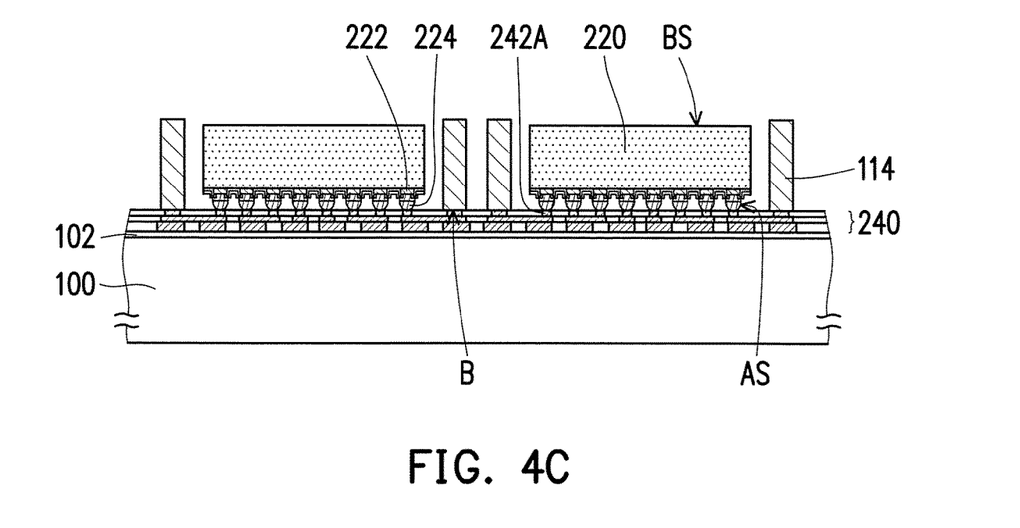

Referring to FIG. 4C, a chip 220 is picked-up and placed on the redistribution layer 240. The chip 220 includes the active surface AS and the back surface BS opposite to the active surface AS. The active surface AS of the chip 220 is electrically connected to the redistribution layer 240. The conductive frame 114 surrounds the chip 220. In some embodiment, the chip 220 includes chip pads 222 and conductive bumps 224 formed on the active surface AS thereof. The conductive bumps 224 are electrically connected to the chip pads 222A material of the conductive bumps 224 includes copper, tin, gold, nickel, or other conductive materials. For example, the conductive bump 224 may be a single-layer structure or a multi-layer structure formed of copper, gold, nickel, or other conductive materials.

Figure 4D:
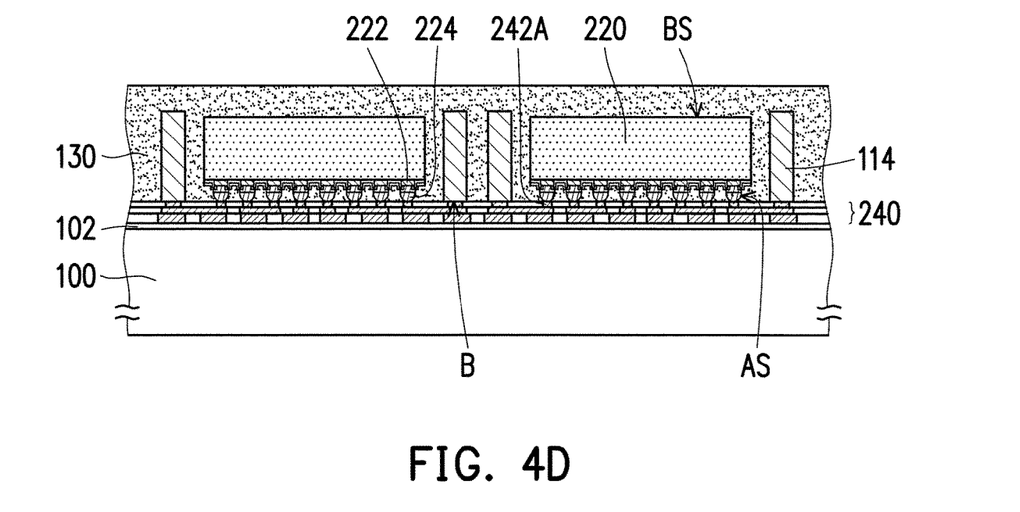

Referring to FIG. 4D, the insulation encapsulation 130 is formed to cover or encapsulate the pads 242A, the chip 120 and the conductive frame 114. In some embodiment, the insulation encapsulation 130 may be formed on the pads 242A carried by the carrier 100 by performing a molding process.

Figure 4E:
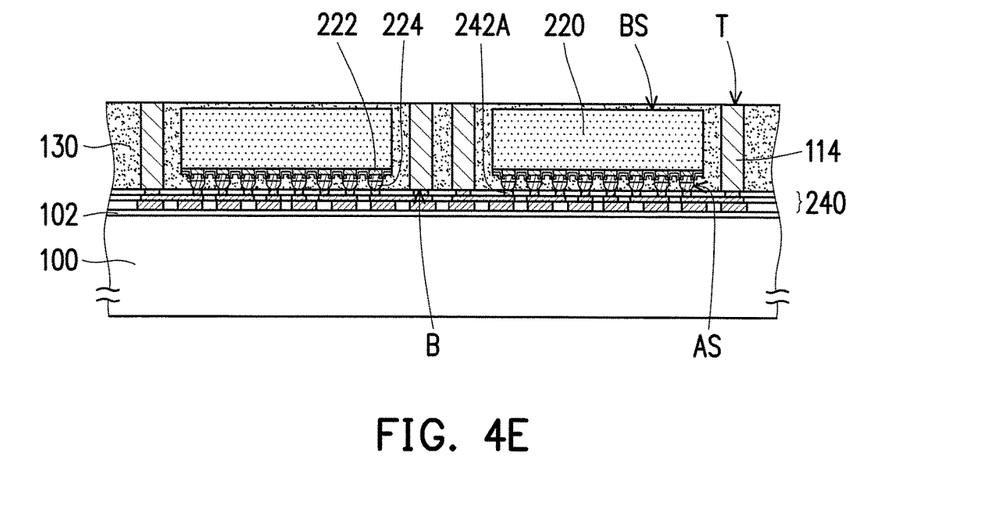

Referring to FIG. 4E, a grinding process is performed on the insulation encapsulation 130 to remove a portion of the insulation encapsulation 130 until a second surface T of the conductive frame 114 is exposed. The grinding process includes performing a mechanical grinding process, a chemical-mechanical grinding (CMP) process, an etching process, other suitable processes, or the combinations thereof. The conductive frame 114 may extend in a direction perpendicular to the carrier 100, and the thickness of the conductive frame 114 is greater than a thickness of the chip 220. Therefore, when the insulation encapsulation 130 exposes the second surface T of the conductive frame 114 after the portion of the insulation encapsulation 130 is removed by the grinding process, the chip 220 is not ground. In some embodiment, after the conductive frame 114 is exposed by the grinding process, the conductive frame 114 may be further ground to reduce the overall thickness of the packaging structure. In some embodiment, the back surface BS of the chip 220 is exposed after a portion of the insulation encapsulation 130 is removed by the grinding process. In some embodiment, the back surface BS of the chip 220 is ground to further reduce the thickness of the chip 220. Since the grinding process is performed on the back surface BS of the chip 220, the circuits on the active surface AS of the chip 220 are not damaged during grinding. In some embodiment, the thickness of the conductive frame 114 is equal to the thickness of the chip 220. Therefore, when the insulation encapsulation 130 exposes the second surface T of the conductive frame 114 after the portion of the insulation encapsulation 130 is removed by the grinding process, the back surface BS of the chip 220 is also exposed by the insulation encapsulation 130.

Figure 4F:
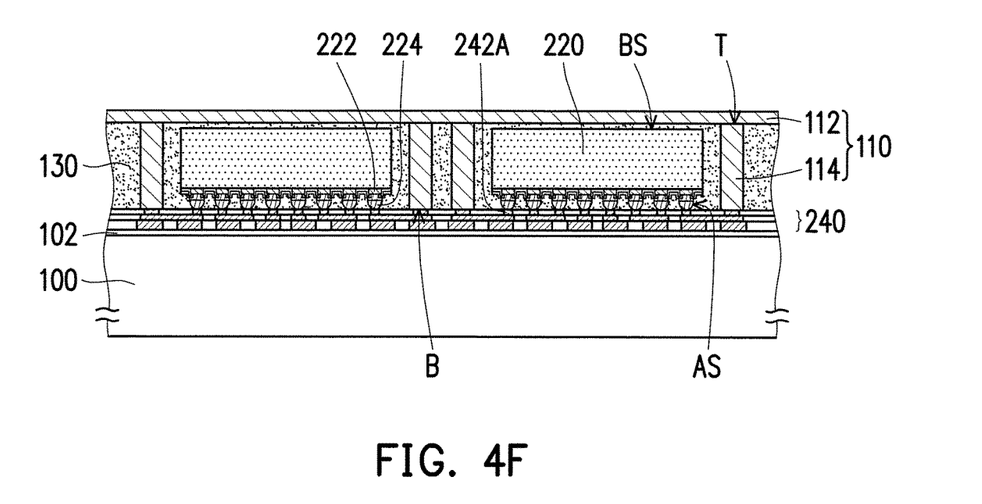

Referring to FIG. 4F, the conductive layer 112 is formed on the insulation encapsulation 130. The second surface T of the conductive frame 114 is in contact with and electrically connected to the conductive layer 112. In some embodiment, the conductive frame 114 and the conductive layer 112 are connected and integrated to form the conductive casing 110. The conductive casing 110 covers all the surfaces of the chip 220 except for the active surface AS. A process of forming the conductive layer 112 may include performing a physical vapor deposition process (e.g., sputtering) or an electroplating process. A material of the conductive layer 112 may include copper, tin, aluminum, steel, or other suitable conductive material. In some embodiment, a portion of the insulation encapsulation 130 is sandwiched between the chip 220 and the conductive layer 112. However, the invention is not limited thereto. In other embodiments, the back surface BS of the chip 220 is in contact with the conductive layer 112. Therefore, heat from the chip may be directly dissipated through the conductive layer 112.

Figure 4G:
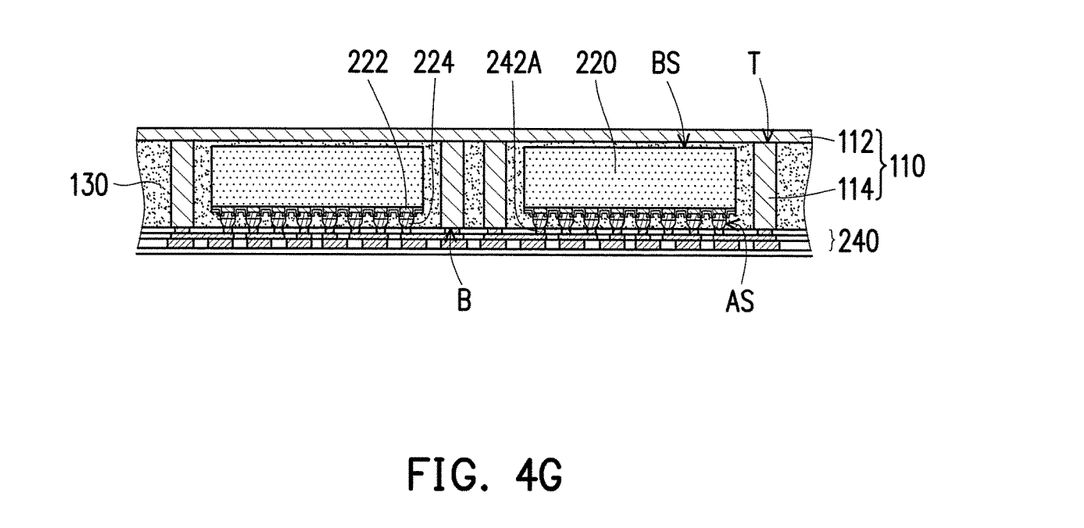

Referring to FIG. 4G, the carrier 100 is removed or de-bonded from the redistribution layer 240. In the embodiment, the conductive casing 110, the chip 220, the insulation encapsulation 130, and the redistribution 240 are formed on the carrier 100 without the need of being transferred to another temporary carrier. Thus, the manufacturing process of the conductive casing 110 is simplified, and the manufacturing cost is reduced.

Figure 4H:
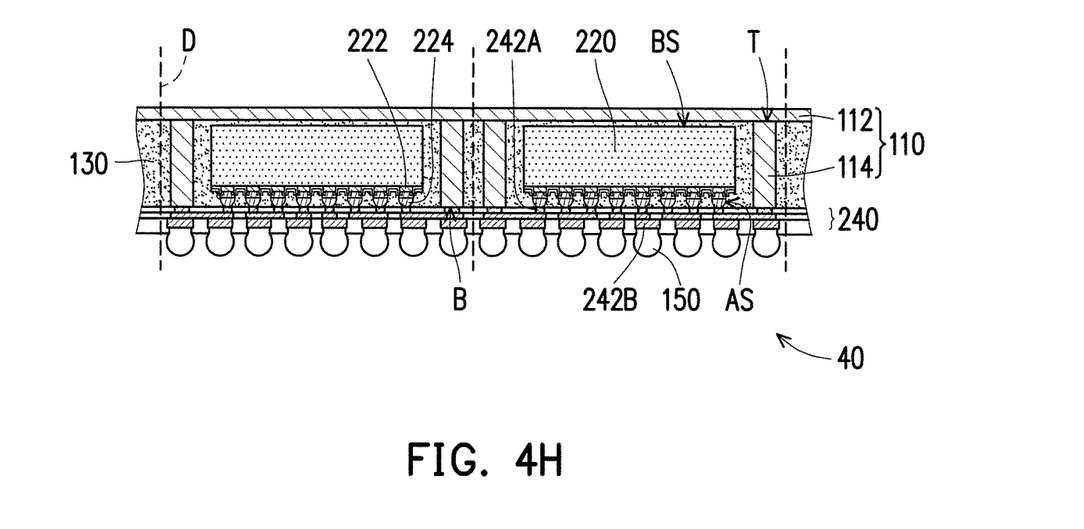

Referring to FIG. 4H, the conductive balls 150 are formed on the redistribution layer 240, and the redistribution layer 240 is located between the conductive balls 150 and the chip 220. The conductive balls 150 are electrically connected with the pads 242B of the redistribution layer 240. A singulation process is performed to form a plurality of singulated packaging structures 40. For example, the singulation process is performed by singulating the adjacent packaging structures 40 along the scribe lines D. However, the invention is not limited thereto. In some embodiments, each singulated packaging structure includes a plurality of the chips 220 separated from one another by the conductive frame.

Figure 4I:
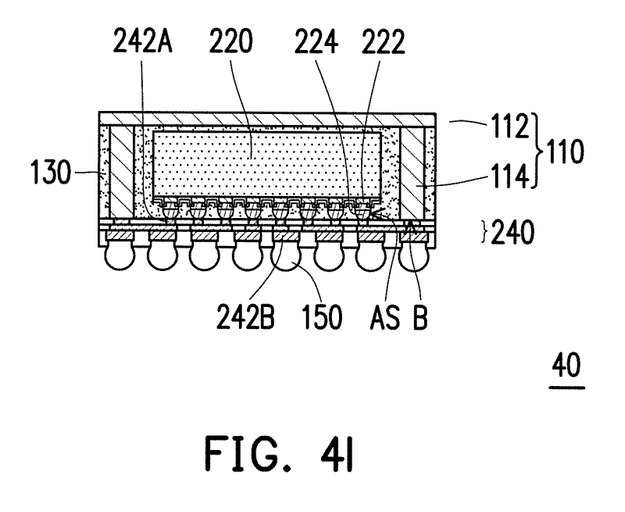

Referring to FIGS. 4I, the packaging structure 40 of the embodiment includes the conductive casing 110, the chip 220, the insulation encapsulation 130, the redistribution layer 240, and the conductive balls 150. The conductive casing 110 includes the conductive layer 112 and the conductive frame 114. The conductive casing 110 is able to reduce the electromagnetic interferences suffered by the chip 220. The conductive casing 110, the chip 220, the insulation encapsulation 130, and the redistribution 240 in the packaging structure 40 according to the embodiment of the invention are formed on the carrier 100 without the need of being transferred to other temporary carrier. Thus, the manufacturing process is simpler, and the manufacturing cost is reduced.

In view of the foregoing, the packaging structure according to the embodiments of the invention includes the conductive casing capable of reducing the electromagnetic interferences suffered by the chip. Besides, most of the manufacturing process of the packaging structure according to the embodiments of the invention is carried out on the same carrier. Thus, the manufacturing process is simpler, and the manufacturing cost is also reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
   providing a carrier;
   forming a redistribution layer on the carrier;
   forming a conductive frame on the redistribution layer;
   placing a plurality of chips on the redistribution layer, wherein each of the chips comprises an active surface, a back surface opposite to the active surface, and a plurality of lateral surfaces connecting to the active surface and the back surface, the active surface of each of the chips is electrically connected to the redistribution layer, and the conductive frame surrounds the lateral surfaces of each of the chips;
   forming an insulation encapsulation to encapsulate the chips; and
   forming a conductive layer on the insulation encapsulation, wherein the conductive layer is a continuous conductive film and covers the chips only on the back surfaces of the chips, the conductive frame and the conductive layer are connected and integrated to form a conductive casing configured to completely cover all the lateral surfaces and the back surface of each of the chips.

2. The manufacturing method as claimed in claim 1, wherein the conductive frame is electrically connected to the redistribution layer.

3. The manufacturing method as claimed in claim 1, further comprising:
dividing up the insulation encapsulation to separate the chips, and each packaging structure comprises two or more of the chips.

4. The manufacturing method as claimed in claim 1, wherein the conductive frame separates the chips from one another.

5. The manufacturing method as claimed in claim 1, wherein each of the chips comprises a plurality of chip pads on the active surface and a plurality of conductive bumps on the chip pads.

6. The manufacturing method as claimed in claim 1, wherein a process of forming the conductive layer includes performing a physical vapor deposition process or performing an electroplating process.

7. The manufacturing method as claimed in claim 1, wherein the conductive casing, the chips, the insulation encapsulation, and the redistribution layer are formed on the carrier.

8. The manufacturing method as claimed in claim 1, wherein the insulation encapsulation is between the chips and the conductive layer.

9. The manufacturing method as claimed in claim 1, wherein a thickness of the conductive frame is greater than a thickness of the chips.

10. The manufacturing method as claimed in claim 1, wherein a process of forming the insulation encapsulation includes a molding process followed by a grinding process.

* * * * *